(12) United States Patent
Chang et al.

(10) Patent No.: US 12,094,996 B2
(45) Date of Patent: Sep. 17, 2024

(54) ELECTRONIC DEVICE AND MANUFACTURING METHOD OF THE SAME

(71) Applicants: Raynergy Tek Incorporation, Hsinchu (TW); Shinera Co., Ltd., New Taipei (TW)

(72) Inventors: Yi-Ming Chang, Hsinchu (TW); Chun-Chieh Lee, Hsinchu (TW); Jui-Chih Kao, Hsinchu (TW); Nai-Wei Teng, Hsinchu (TW)

(73) Assignees: RAYNERGY TEK INCORPORATION, Hsinchu (TW); SHINERA CO., LTD., New Taipei (TW)

( * ) Notice: Subject to any disclaimer, the term of this patent is extended or adjusted under 35 U.S.C. 154(b) by 0 days.

(21) Appl. No.: 17/575,019

(22) Filed: Jan. 13, 2022

(65) Prior Publication Data
US 2022/0344530 A1   Oct. 27, 2022

(30) Foreign Application Priority Data

Apr. 27, 2021   (TW) ................................ 110115126

(51) Int. Cl.
*H01L 31/18* (2006.01)
*H01L 31/0224* (2006.01)
*H01L 31/0392* (2006.01)

(52) U.S. Cl.
CPC .. *H01L 31/1804* (2013.01); *H01L 31/022425* (2013.01); *H01L 31/0392* (2013.01); *H01L 31/1852* (2013.01)

(58) Field of Classification Search
CPC ............... H01L 31/046; H01L 31/0463; H01L 31/0465; H01L 31/0468; H01L 31/0475
See application file for complete search history.

(56) References Cited

U.S. PATENT DOCUMENTS

| 2009/0056801 | A1 | 3/2009 | Lu et al. |
| 2012/0028404 | A1* | 2/2012 | Frey ............... B23K 26/0624 257/E31.11 |
| 2021/0020799 | A1* | 1/2021 | Verma ................... H01L 31/046 |

FOREIGN PATENT DOCUMENTS

TW   201304158 A   1/2013

OTHER PUBLICATIONS

Taiwan Patent Office "Notice of Allowance" issued on Jan. 3, 2022, Taiwan.

* cited by examiner

*Primary Examiner* — Daniel P Malley, Jr.
(74) *Attorney, Agent, or Firm* — WPAT, PC

(57) ABSTRACT

An electronic device includes a substrate, a plurality of electronic components and a conductive material. The electronic components are arranged on the substrate, and the electronic components respectively include a lower electrode, a semiconductor layer and an upper electrode, and they are sequentially stacked on the substrate. The electronic components share the semiconductor layer, and the semiconductor layer forms a plurality of connecting channels through the semiconductor layer. The connecting channels are located between the upper electrode of the first electronic component in the electronic components and the lower electrode of the second electronic component in the electronic components. These connecting channels are processed by lasers of different powers. The conductive material is arranged in the connecting channel so that the upper electrode of the first electronic component is electrically connected to the lower electrode of the second electronic component.

5 Claims, 13 Drawing Sheets

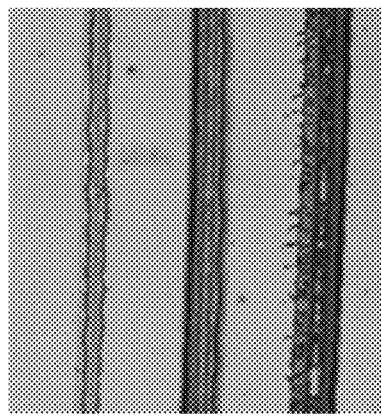  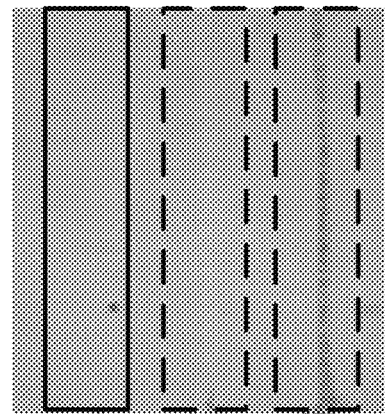
FIG. 3A            FIG. 3B
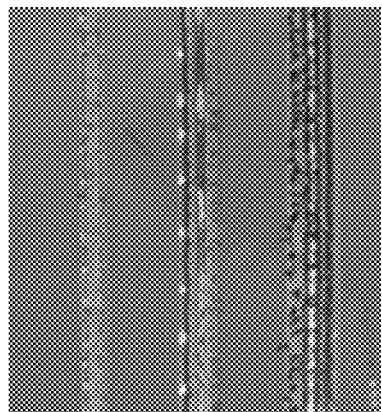  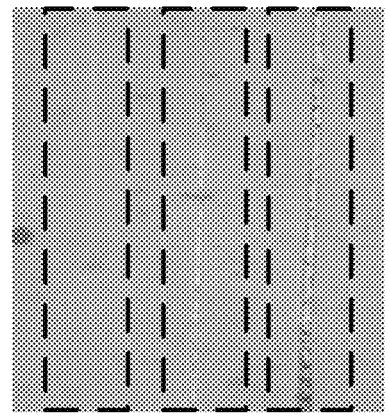
FIG. 3C            FIG. 3D

ELECTRONIC DEVICE AND MANUFACTURING METHOD OF THE SAME

The present application is based on, and claims priority from, Republic of China (Taiwan) application number TW110115126, filed on 2021 Apr. 27, the disclosure of which is hereby incorporated by reference herein in its entirety.

BACKGROUND OF THE INVENTION

Field of the Invention

The present invention relates to an electric device comprising a plurality of electronic components electrically connecting with each other, and a manufacturing method of the electric device.

DESCRIPTION OF THE PRIOR ART

In view of global warming, climate change has become a common challenge in the international communities. The Kyoto protocol proposed by the "United Nations Framework Convention on Climate Change (UNFCCC)" in 1997 which had entered into force in 2005 is aimed at reducing carbon dioxide emissions. In this regard, countries are focusing on the development of renewable energy to reduce the use of petrochemical fuels. As the sun provides far enough energy needs of people at present and for the future, renewable energy becomes a major concern for solar power generation, which has led to the use of organic photoelectric devices for solar power generation as the primary development target.

In order to improve the photoelectric conversion efficiency of electronic device, in addition to improving the materials of the electronic device, the improvement of the manufacturing process of the electronic device is also one of the important issues to maximize the effectiveness of the materials. Due to the manufacturing process is a large-area manufacturing, it is easy to cause problems that are easily visible in mass production, and it is also easy to produce uneven manufacturing process defects. For example, when the semiconductor layer material is deposited on a large area, the thickness of the semiconductor layer material in each area will inevitably be different, which will easily affect the subsequent laser ablation and series and parallel connections. The prior art uses a single-power laser for laser ablation. However, when the single-power laser is ablated on the semiconductor layer materials of different thicknesses, the problem of inconsistent laser ablation levels will occur. Then, the connection channels among electronic components may not be conductive due to incomplete ablation, or the structure of the lower electrode is damaged due to excessive ablation, which in turn leads to problems such as a decrease in the electrical conductivity of the lower electrode itself. In this regard, how to improve the influence of the uneven thickness of the semiconductor layer material on the subsequent laser ablation is a very important issue at present.

SUMMARY OF THE INVENTION

In view of this, one category of the present invention is to provide an electronic device. The electronic device comprises a substrate, a plurality of electronic components and a conductive material. The electronic components are configured on the substrate, and the electronic components include a lower electrode, a semiconductor layer and an upper electrode sequentially stacked on the substrate. The electronic components share the semiconductor layer, wherein the semiconductor layer forms a plurality of connecting channels penetrating the semiconductor layer. The connecting channels are located between the upper electrode of a first electronic component in the electronic components and the lower electrode of a second electronic component in the electronic components. The connecting channels are generated by the laser with different powers. The conductive material is configured in the connecting channels to electrically connect the upper electrode of the first electronic component and the lower electrode of the second electronic component.

Wherein, the connecting channels comprise a first channel penetrating the semiconductor layer and coupling a surface of the upper electrode of the first electronic component and a surface of the lower electrode of the second electronic component according to the power of the laser.

Wherein, the connecting channels further comprise at least one of a second channel and a third channel according to the power of the laser, the second channel un-penetrates the semiconductor layer, the third channel penetrates the semiconductor layer and couples the upper electrode of the first electronic component and a depression on the lower electrode of the second electronic component, and the depression is generated by the laser.

Wherein, an electrical conductivity of the first channel containing the conductive material is higher than that of the third channel containing the conductive material.

Wherein, the electronic device comprises at least one of a photovoltaic device, a photodiode, a light-emitting diode, a capacitor, and a transistor.

Another category of the present invention is to provide a manufacturing method of electronic device comprising the following steps: providing a substrate, and forming a first lower electrode a second lower electrode and an insulating material on the substrate, wherein the insulating material is configured between the first lower electrode and the second lower electrode; forming a semiconductor layer on the first lower electrode, the second lower electrode and the insulating material; performing multiple laser processing with different powers on a position of the semiconductor layer corresponding to the second lower electrode to form a plurality of connecting channels which are vertical; configuring a conductive material in the connecting channels; and disposing a first upper electrode and a second upper electrode on the semiconductor layer and the conductive material, wherein the first upper electrode covers the connecting channels and the conductive material. Wherein, the first upper electrode, the first lower electrode and the semiconductor layer between them form a first electronic component. The second upper electrode, the second lower electrode and the semiconductor layer between them form a second electronic component. The first upper electrode of the first electronic component and the second lower electrode of the second electronic component are electrically connected through the connecting channels and the conductive material.

Wherein, the power difference range of the multiple laser processing is between 3% to 20%.

Wherein, the step of performing multiple laser processing with different powers on the position of the semiconductor layer corresponding to the second lower electrode to form the connecting channels which are vertical further comprises the following sub-step: processing the semiconductor layer with a first laser having a first power to form a first channel which is vertical. Wherein, a part of the semiconductor layer on a path of the first laser is removed during the processing of the first laser, so as to form the first channel penetrating the semiconductor layer and coupling a surface of the first upper electrode of the first electronic component and a surface of the second lower electrode of the second electronic component.

Wherein, the step of performing multiple laser processing with different powers on the position of the semiconductor layer corresponding to the second lower electrode to form the connecting channels which are vertical further comprises at least one of the following sub-steps: processing the semiconductor layer with a second laser having a second power to form a second channel; and processing the semiconductor layer with a third laser having a third power to form a third channel. Wherein, a part of the semiconductor layer on a path of the second laser is removed and a part of the semiconductor layer which is un-ablated by the second laser is remained during the processing of the second laser, so as to form the second channel un-penetrating the semiconductor layer; a part of the semiconductor layer on a path of the third laser is removed and a depression in the second lower electrode is formed during the processing of the third laser, so as to form the third channel penetrating the semiconductor layer and coupling the first upper electrode and the depression of the second lower electrode.

The present invention further provides a further manufacturing method of electronic device comprising the following steps: providing a substrate, and forming a first lower electrode, a second lower electrode, a third lower electrode and an insulating material on the substrate, wherein the insulating material is configured between the first lower electrode and the second lower electrode and between the second lower electrode and the third lower electrode; forming a semiconductor layer on the first lower electrode, the second lower electrode, the third lower electrode and the insulating material; performing multiple laser processing with different powers on a position of the semiconductor layer corresponding to the second lower electrode and a position of the semiconductor layer corresponding to the third lower electrode to form a plurality of connecting channels which are vertical; configuring a conductive material in the connecting channels; and disposing a first upper electrode, a second upper electrode and a third upper electrode on the semiconductor layer and the conductive material. Wherein, the first upper electrode covers the connecting channels and the conductive material corresponding to the second lower electrode, and the second upper electrode covers the connecting channels and the conductive material corresponding to the third lower electrode. Wherein, the first upper electrode, the first lower electrode and the semiconductor layer between them form a first electronic component. The second upper electrode, the second lower electrode and the semiconductor layer between them form a second electronic component. The third upper electrode, the third lower electrode and the semiconductor layer between them form a third electronic component. The first upper electrode of the first electronic component and the second lower electrode of the second electronic component are electrically connected through the connecting channels and the conductive material and the second upper electrode of the second electronic component and the third lower electrode of the third electronic component are electrically connected through the connecting channels and the conductive material.

Compared with the prior art, the electronic device of the present invention is processed on the semiconductor layer by multiple lasers with different powers, so as to solve the problem of the laser processing defects caused by the formation of the semiconductor layer with different thicknesses due to uneven film deposition during large-scale deposition of the semiconductor layer.

BRIEF DESCRIPTION OF THE APPENDED DRAWINGS

Some of the embodiments will be described in detail, with reference to the following figures, wherein like designations denote like members, wherein:

FIG. 3A shows an ablation test results of applying lasers with different powers to a semiconductor layer with a thickness of about 350 nm.

FIG. 3B shows the results of the ablation test after removing the semiconductor layer of FIG. 3A.

FIG. 3C shows an ablation test results of applying lasers with different powers to a semiconductor layer with a thickness of about 250 nm.

FIG. 3D shows the results of the ablation test after removing the semiconductor layer of FIG. 3C.

The advantages, spirits, and features of the present invention will be explained and discussed with embodiments and figures as follows.

DETAILED DESCRIPTION OF THE INVENTION

In order to make the advantages, spirit and features of the present invention easier and clearer, it will be detailed and discussed in the following with reference to the embodiments and the accompanying drawings. It is worth noting that the specific embodiments are merely representatives of the embodiments of the present invention, but it can be implemented in many different forms and is not limited to the embodiments described in this specification. Rather, these embodiments are provided so that this disclosure will be thorough and complete.

The terminology used in the various embodiments disclosed in the present invention is only for the purpose of describing specific embodiments, and is not intended to limit the various embodiments disclosed in the present invention. As used herein, singular forms also include plural forms unless the context clearly indicates otherwise. Unless otherwise defined, all terms (including technical and scientific terms) used in this specification have the same meanings as commonly understood by one of ordinary skill in the art to which the various embodiments disclosed herein belong. The above terms (such as those defined in commonly used dictionaries) will be interpreted as having the same meaning as the contextual meaning in the same technical field, and will not be interpreted as having an idealized or overly formal meaning, unless explicitly defined in the various embodiments disclosed herein.

In the description of this specification, the description of the reference terms "an embodiment", "a specific embodiment" and the like means that specific features, structures, materials, or characteristics described in connection with the embodiment are included in at least one embodiment of the present invention. In this specification, the schematic expressions of the above terms do not necessarily refer to the same embodiment. Furthermore, the particular features, structures, materials, or characteristics described may be combined in any suitable manner in any one or more embodiments.

Figure 1:
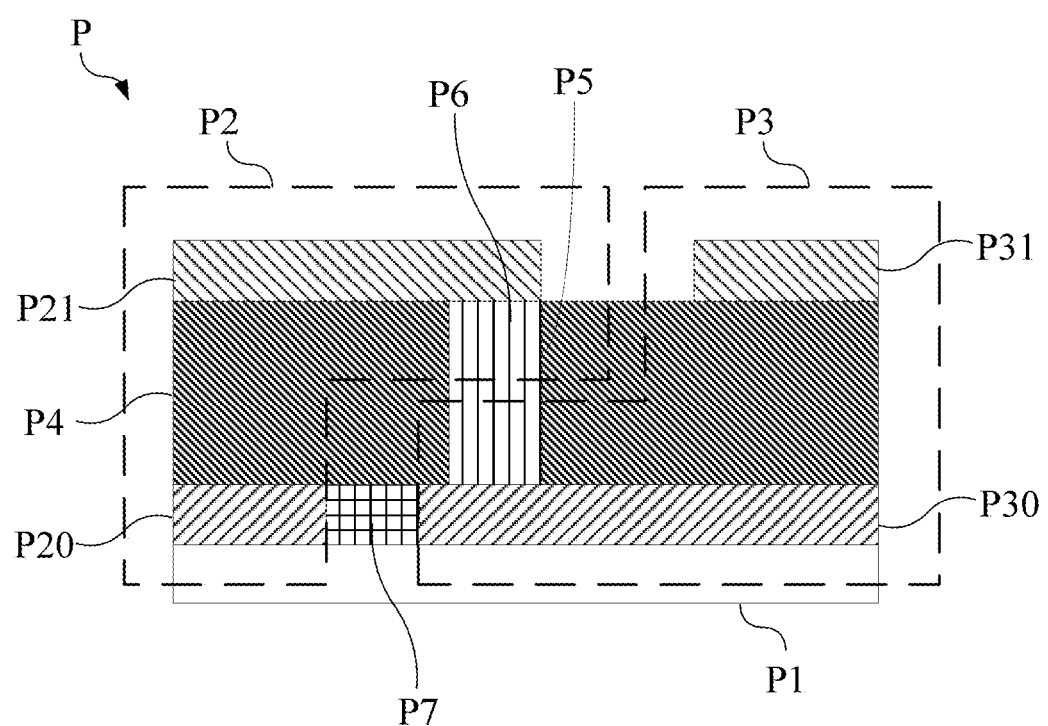
FIG. 1 shows a schematic structural diagram of an electronic device of the prior art.

Please referring to FIG. 1, FIG. 1 shows a schematic structural diagram of an electronic device P of the prior art. The structure of the electronic device P in the prior art is shown in FIG. 1. The electronic device P includes a substrate P1, a first electronic component P2, a second electronic component P3, and a conductive material P6. The first electronic component P2 and the second electronic component P3 are disposed on the substrate P1. The first electronic component P2 includes a first lower electrode P20, a semiconductor layer P4 and a first upper electrode P21, and the second component P3 includes a second lower electrode P30, the semiconductor layer P4, and the second upper electrode P31. The first lower electrode P20 and the second lower electrode P30, the semiconductor layer P4, and the first upper electrode P21 and the second upper electrode P31 are sequentially stacked on the substrate P1. The first electronic component P2 and the second electronic component P3 share the semiconductor layer P4, wherein the semiconductor layer P4 forms a connection channel P5 that penetrates the semiconductor layer P4. The connecting channel P5 is located between the first upper electrode P21 and the second lower electrode P30. The conductive material P6 is disposed in the connection channel P5, so that the first upper electrode P21 is electrically connected to the second lower electrode P30. In the structure of FIG. 1, the ideal electronic component P has no manufacturing problems.

Figure 2:
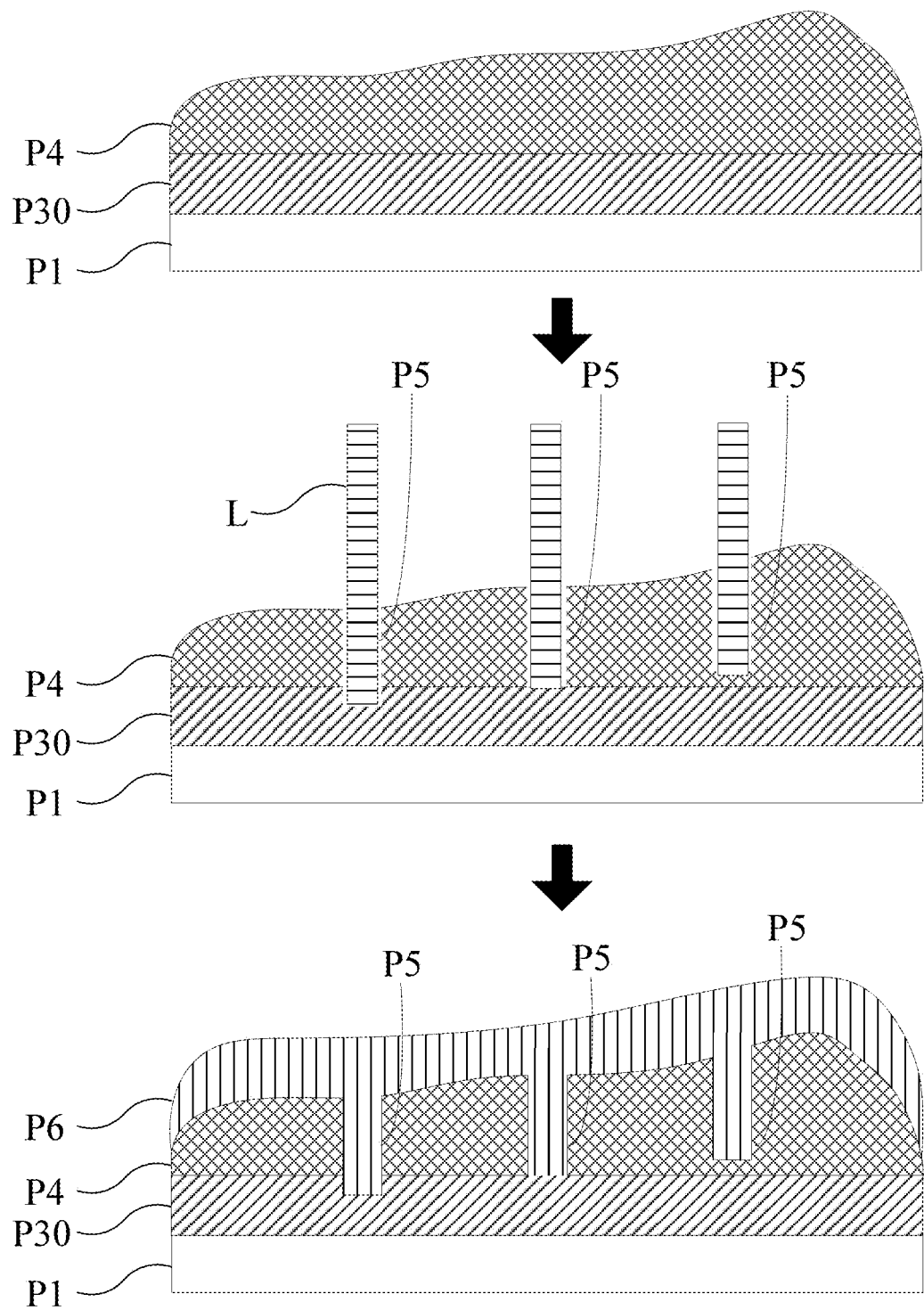
FIG. 2 shows an ablation process of applying laser with a single power to a semiconductor layer with different thicknesses in the prior art.
Figure 4A:
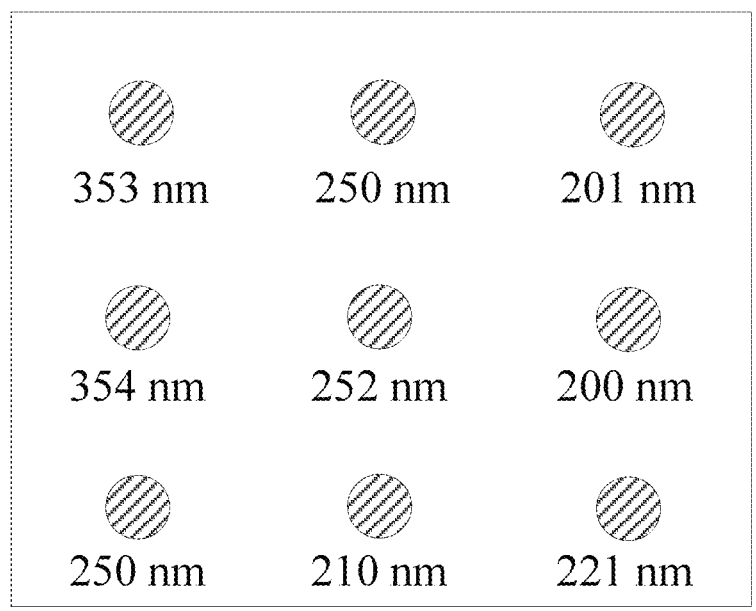
FIG. 4A shows a schematic diagram of the thickness distribution of the semiconductor layer deposited on a large area.

However, please refer to FIGS. 2 to 4A. FIG. 2 shows an ablation process of applying laser with a single power to a semiconductor layer with different thicknesses in the prior art. FIG. 3A shows an ablation test results of applying lasers with different powers to a semiconductor layer with a thickness of about 350 nm. FIG. 3B shows the results of the ablation test after removing the semiconductor layer of FIG. 3A. FIG. 3C shows an ablation test results of applying lasers with different powers to a semiconductor layer with a thickness of about 250 nm. FIG. 3D shows the results of the ablation test after removing the semiconductor layer of FIG. 3C. FIG. 4A shows a schematic diagram of the thickness distribution of the semiconductor layer deposited on a large area. As shown in FIG. 2 and FIG. 4A, in the actual manufacturing process, when a semiconductor layer 13 is deposited on a large area, the problem of uneven deposition thickness will inevitably occur. In FIG. 4A, it can be seen that in a single area of the semiconductor layer 13, the thickness of the semiconductor layer 13 can range from 200 nm to 354 nm. Therefore, in the process of the prior art, the cross section of the semiconductor layer 13 in actual operation will be as shown in FIG. 2. This will result in the subsequent laser ablation process, as shown in FIG. 2; if laser L of the same power is used for processing, the problem of uneven ablation will occur. Wherein, the results of ablation process include incomplete ablation, ideal ablation, and excessive ablation. The incomplete ablation means that part of the material of the semiconductor layer 13 remains on the surface of the lower electrode 12. Because of the remaining material, it will form additional resistance and affect the current transfer between the upper electrode 11 and the lower electrode 12. The ideal ablation means that the target semiconductor layer 13 is completely removed, and the laser processing does not damage the surface of the lower electrode 12. At this time, the electrical conductivity between the upper electrode 11 and lower electrode 12 is the best. The excessive ablation means that although the target semiconductor layer 13 is completely removed, it damages the surface of the lower electrode 12, and then causes a depression 121 on the surface of the lower electrode 12. When the ablation is excessive, the lower electrode 12 is damaged, resulting in a decrease in its own electrical conductivity, which in turn affects the electrical conductivity of the electronic device D.

For further explanation, as shown in FIG. 3A to FIG. 3D. Lasers with powers of 12%, 13%, and 14% are applied from left to right on the semiconductor layer 13 with a thickness of 350 nm (as shown in FIG. 3A) and 250 nm (as shown in FIG. 3C). Then, the semiconductor layer 13 with the thickness of about 350 nm (as shown in FIG. 3A) is removed to form the ablation test result as shown in FIG. 3B, and the semiconductor layer 13 with the thickness of about 250 nm (as shown in FIG. 3C) is removed to form the ablation test result as shown in FIG. 3D. Wherein, the solid square boxes in FIG. 3B and FIG. 3D are the test results of ideal ablation, and the dotted square boxes are the test results of excessive ablation. As shown in FIG. 3B, at 350 nm, the laser with the power of 12% can ablate the semiconductor layer 13 into the ideal ablation (as shown in the solid square frame in FIG. 3B). However, as shown in FIG. 3D, at 250 nm, the laser with the power of 12% over ablates the semiconductor layer 13 (selected by the dotted square frame in FIG. 3D). Therefore, if the laser ablation is performed by the laser with single power in prior art, the electronic components in the electronic device correspond to the formation of connecting channel with incomplete ablation, ideal ablation, or excessive ablation according to the thickness of the semiconductor layer. In turn, the electrical conductivity of the electronic components is reduced, or even no electricity can be transferred at all.

Figure 4B:
FIG. 4B shows a schematic diagram of the comparison of the laser ablation trajectory design in a single area between the present invention and the prior art.
Figure 5A:
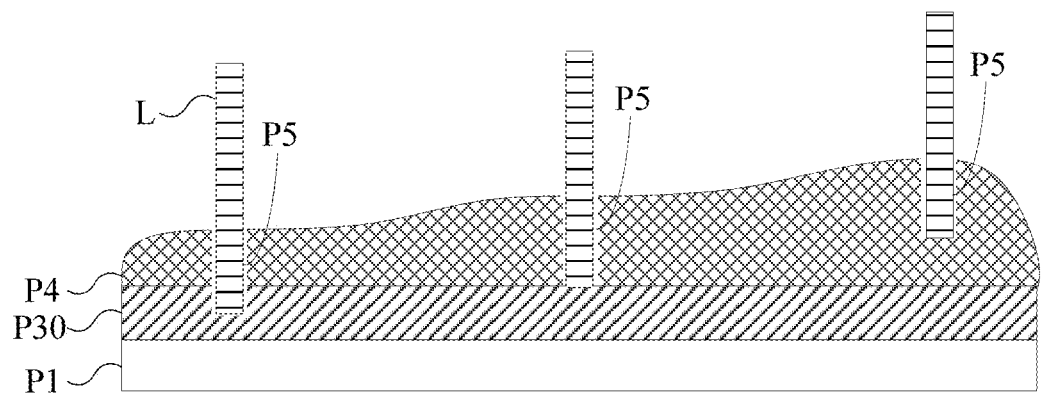
FIG. 5A shows a schematic diagram of laser ablation by applying laser with the single power in the prior art.
Figure 5B:
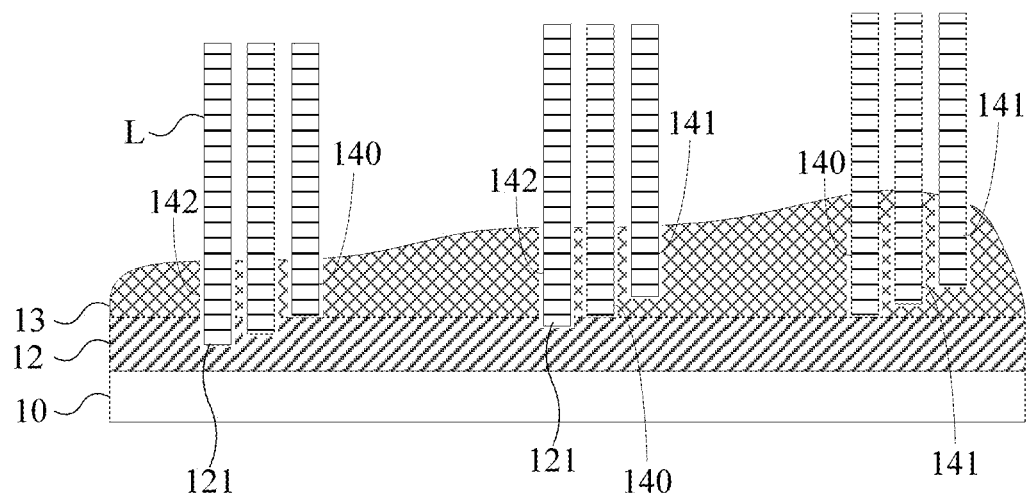
FIG. 5B shows a schematic diagram of laser ablation by applying lasers with the multiple powers of the present invention.
Figure 6:
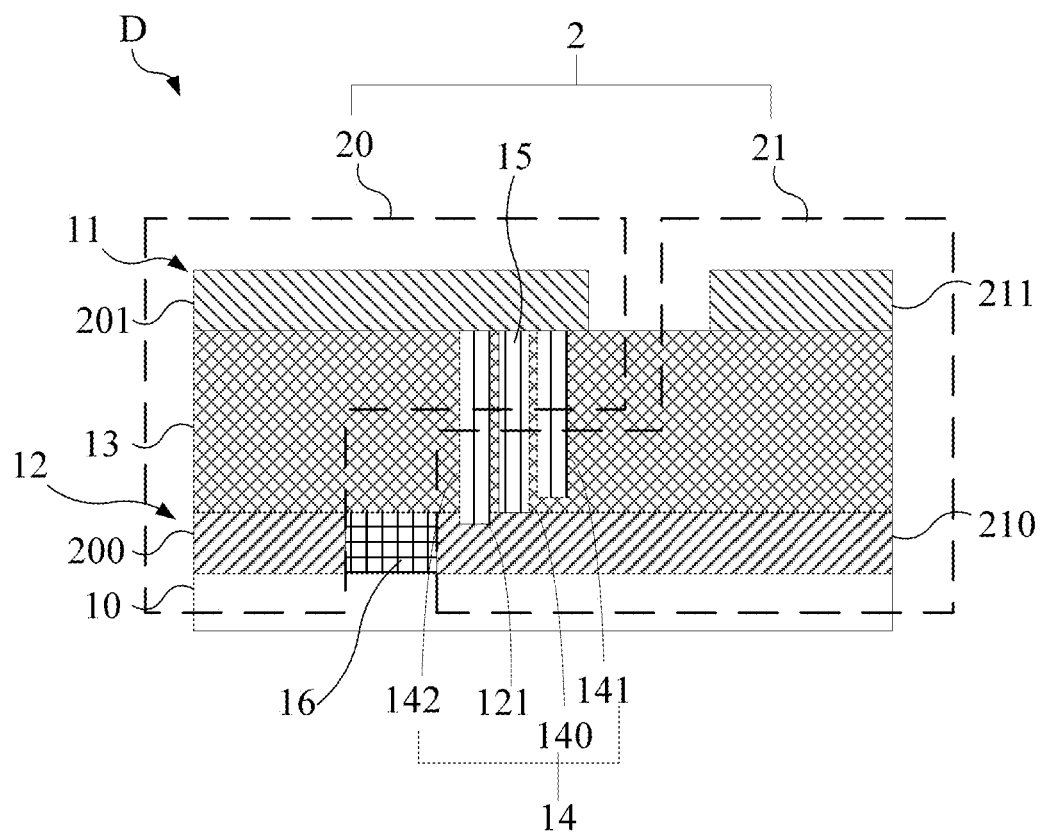
FIG. 6 shows a schematic structural diagram of one embodiment of the electronic device of the present invention.

In order to solve the above problems, the present invention uses lases with multiple powers to perform laser processing. Please refer to FIG. 4B to FIG. 6. FIG. 4B shows a schematic diagram of the comparison of the laser ablation trajectory design in a single area between the present invention and the prior art. FIG. 5A shows a schematic diagram of laser ablation by applying laser with the single power in the prior art. FIG. 5B shows a schematic diagram of laser ablation by applying lasers with the multiple powers of the present invention. FIG. 6 shows a schematic structural diagram of one embodiment of the electronic device of the present invention. As shown in FIG. 4B, FIG. 5A and FIG. 5B, FIG. 4B shows a comparison diagram of ablation trajectory design of the laser ablation between electronic components on a single area by laser with single power in the prior art (such as the left half) and by lasers with the multiple power of the present invention. FIG. 5A is a schematic diagram showing the result of laser ablation by laser L with single power on the semiconductor layer P4 with uneven thickness in the prior art, and FIG. 5B is schematic diagram showing the result of laser ablation by lasers L with multiple powers on the semiconductor layer 13 with uneven thickness in the present invention. Looking at FIG. 4B and FIG. 5A and FIG. 5B respectively, it can be seen that the left half can correspond to the schematic cross-sectional view of FIG. 5A, and the right half can correspond to the schematic cross-sectional view of FIG. 5B. It can be seen from FIG. 5A that if the laser with single power is used for laser ablation, the following conditions will be encountered. When encountering the semiconductor layer P4 with a thickness lower than the average thickness, excessive ablation will occur, which will damage the surface of the lower electrode; when encountering a semiconductor layer P4 with a thickness higher than the average thickness, incomplete ablation will occur, so that the remaining semiconductor layer becomes a resistance and the upper electrode and lower electrode cannot conduct electricity; and only when the thickness of the semiconductor layer is the target average thickness, ideal ablation can occur, which greatly affects the electrical conductivity of the electronic component. As can be seen from FIG. 5B, the present invention will perform multiple laser ablation by lasers with different powers at each unit ablation position. Therefore, no matter what thickness is encountered, an ideal ablation will be formed in the connection channels 14 ablated by the laser L with multiple powers, thereby ensuring that each electronic components 2 in the electronic assembly D will transmit electricity to each other. In other words, the multiple connection channels formed by multiple laser ablation of the present invention replace the single connection channel formed by single laser ablation in the prior art, then the problems of different ablation levels in the laser ablation process caused by semiconductor layer of different thicknesses can be completely addressed.

As shown in FIG. 6, the electronic device D is completed by a multi-power laser ablation process, wherein the electronic device D includes a substrate 10, a plurality of electronic components 2 and a conductive material 15. The electronic components 2 is disposed on the substrate 10, and the electronic components 2 include a lower electrode 12, a semiconductor layer 13, and an upper electrode 11, respectively, and the lower electrode 12, the semiconductor layer 13, and the upper electrode 11 are sequentially stacked on the substrate 10. The electronic components 2 share the semiconductor layer 13, and the semiconductor layer 13 forms a plurality of connection channels 14 penetrating the semiconductor layer 13. The connecting channels 14 are located between a first upper electrode 201 of a first electronic component 20 in the electronic components 2 and a second lower electrode 210 of a second electronic component 21 in the electronic components 2. The connecting channels 14 are generated by laser with different powers. The conductive material 15 is configured in the connecting channels 14 to electrically connect the first upper electrode 201 and the second lower electrode 210.

Since lasers with different powers are used for processing the same channel at the same time, the electronic device D of the present invention must include a first channel 140 penetrating the semiconductor layer 13 and coupling a surface of the first upper electrode 201 and a surface of the second lower electrode 210, which is ideal ablation. In addition, the electronic device D of the present invention may further include at least one of a second channel 141 and a third channel 142. The second channel 141 un-penetrates the semiconductor layer 13, which is incomplete ablation. The third channel 142 penetrates the semiconductor layer 13 and couples the first upper electrode 201 and a depression 121 on the second lower electrode 210, and the depression 121 is generated by the laser, which is excessive ablation. In this regard, although incomplete ablation and excessive ablation may still occur due to the difference in the thickness of the semiconductor layer 13, it ensures the generation of ideal ablation, thereby improving the process yield of the electronic device D.

Since excessive ablation will inevitably affect the electrical conductivity of the second lower electrode 210 itself, the electrical conductivity of the first channel 140 containing the conductive material 15 is higher than that of the third channel 142 containing the conductive material 15. Although the electrical conductivity of the third channel 142 containing the conductive material 15 is lower than the electrical conductivity of the first channel 140 containing the conductive material 15, the third channel 142 of the conductive material 15 can still provide a conductive function between the first upper electrode 201 and the second lower electrode 210.

In practical applications, the electronic device D of the present invention includes at least one of a photovoltaic device, a photodiode, a light-emitting diode, a capacitor, and a transistor.

Figure 7:
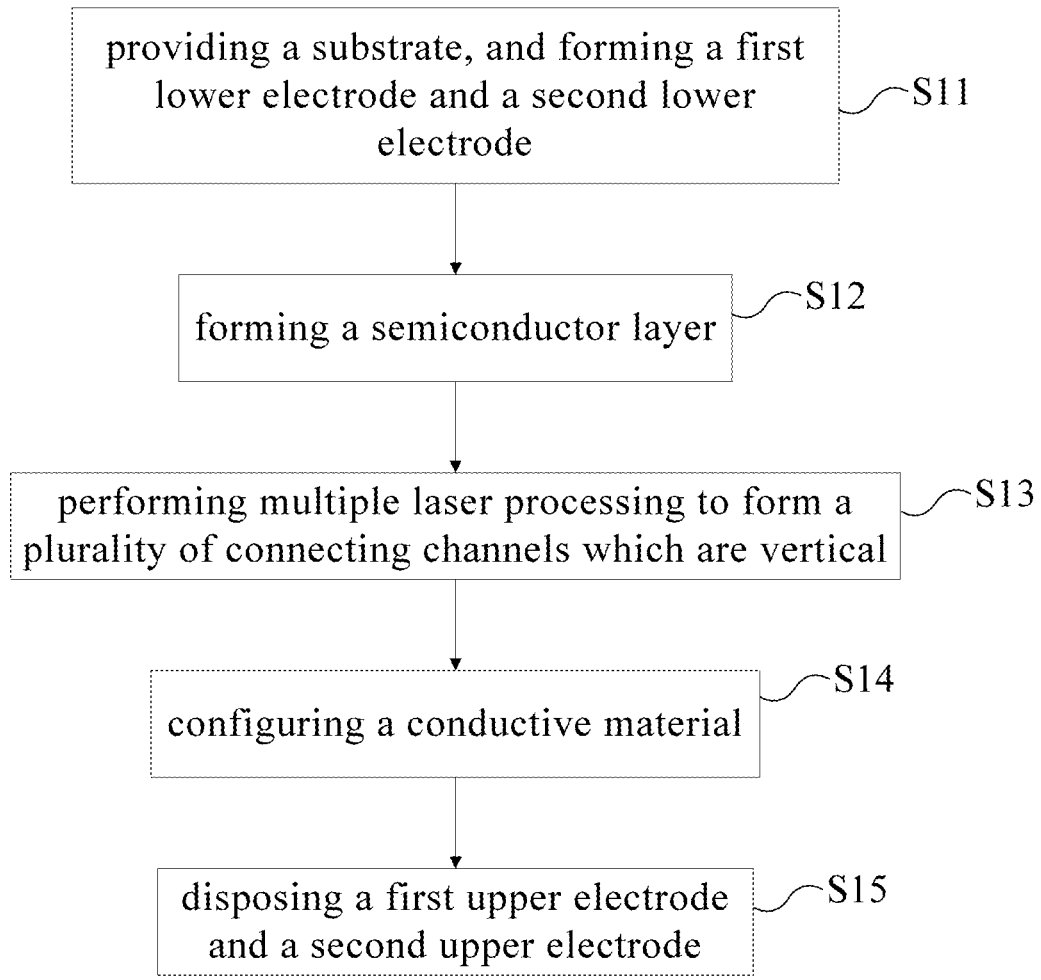
FIG. 7 shows a flowchart of one embodiment of the manufacturing method of the electronic component of the present invention.
Figure 8A:
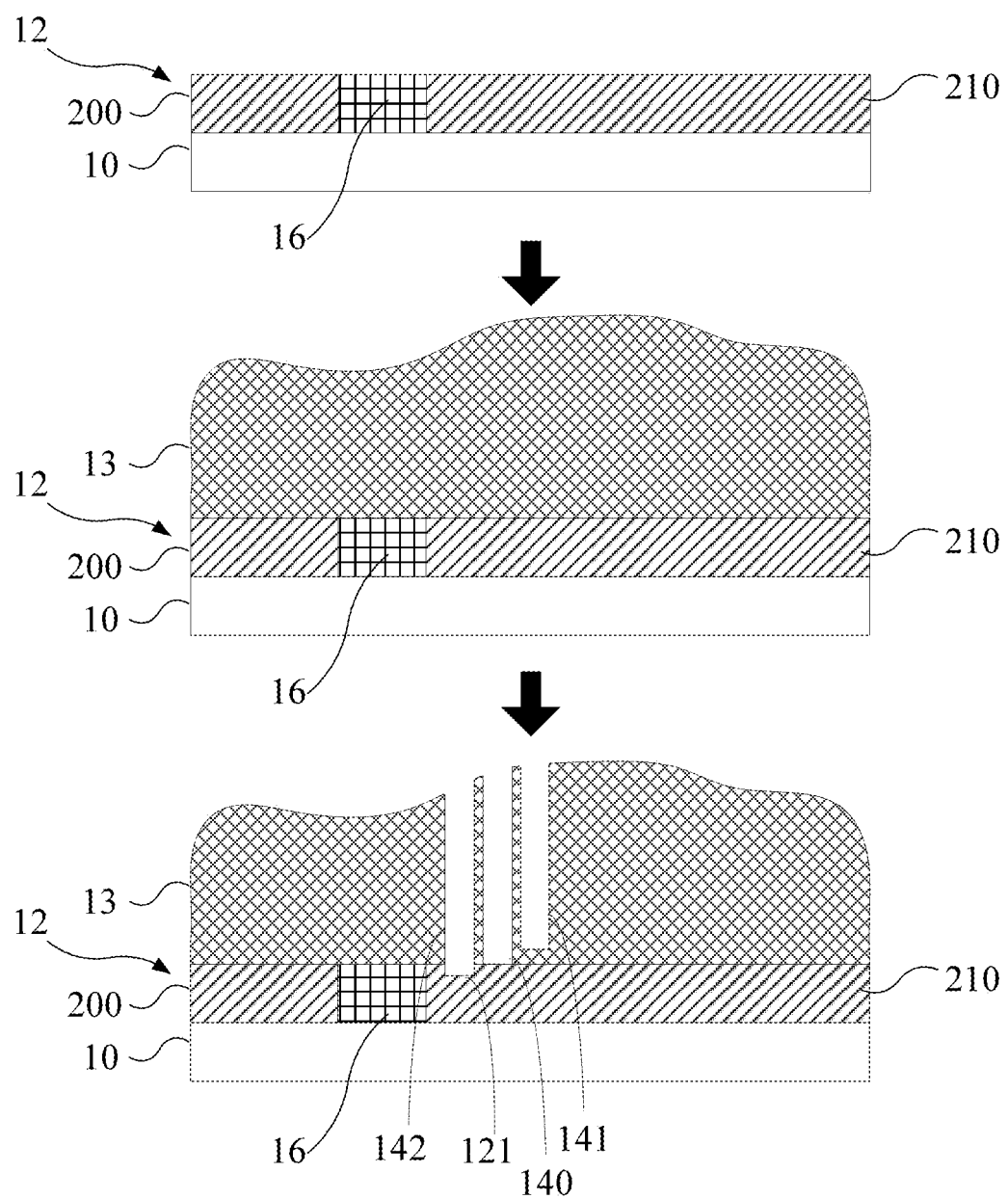
FIGS. 8A and 8B show a schematic diagram of one embodiment of the manufacturing method of the electronic component of the present invention.
Figure 8B:
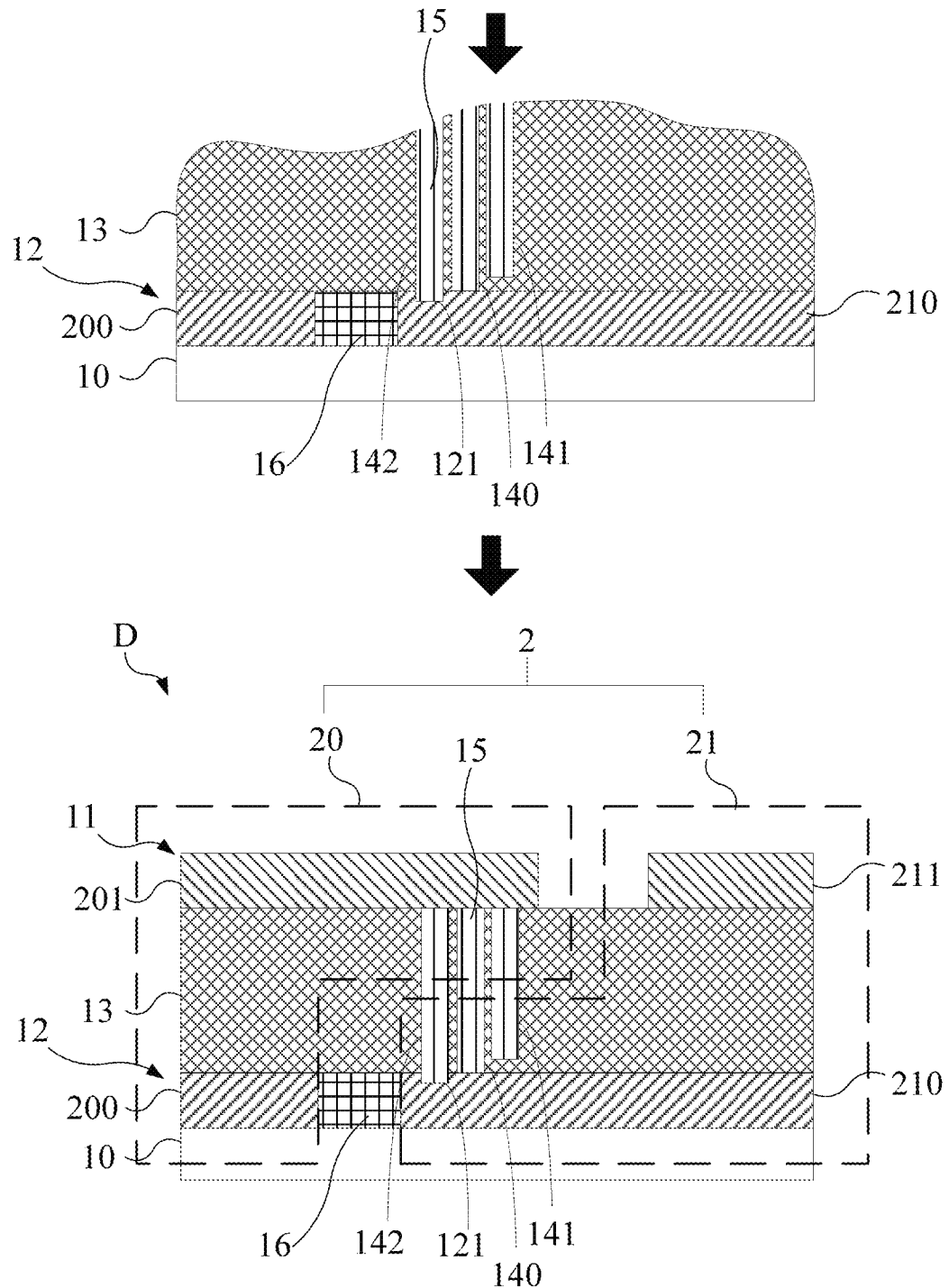

Please refer to FIG. 7 to FIG. 8B. FIG. 7 shows a flowchart of one embodiment of the manufacturing method of the electronic component of the present invention. FIGS. 8A and 8B show a schematic diagram of one embodiment of the manufacturing method of the electronic component of the present invention. As shown in FIG. 7, FIG. 8A and FIG. 8B, a manufacturing method of electronic device comprises the following steps: step S11: providing a substrate 10, and forming a first lower electrode 200, a second lower electrode 210 and an insulating material 16 on the substrate 10, wherein the insulating material 16 is configured between the first lower electrode 200 and the second lower electrode 210; step S12: forming a semiconductor layer 13 on the first lower electrode 200, the second lower electrode 210 and the insulating material 16; step S13: performing multiple laser processing with different powers on a position of the semiconductor layer 13 corresponding to the second lower electrode 210 to form a plurality of connecting channels 14 which are vertical; step S14: configuring a conductive material 15 in the connecting channels 14; and step S15: disposing a first upper electrode 201 and a second upper electrode 211 on the semiconductor layer 13 and the conductive material 15, wherein the first upper electrode 201 covers the connecting channels 14 and the conductive material 15. Wherein, the first upper electrode 201, the first lower electrode 200 and the semiconductor layer 13 between them form a first electronic component 20. The second upper electrode 211, the second lower electrode 210 and the semiconductor layer 13 between them form a second electronic component 21. The first upper electrode 201 of the first electronic component 20 and the second lower electrode 210 of the second electronic component 21 are electrically connected through the connecting channels 14 and the conductive material 15.

Wherein, the power difference range of the multiple laser processing is between 3% to 20%.

Figure 9:
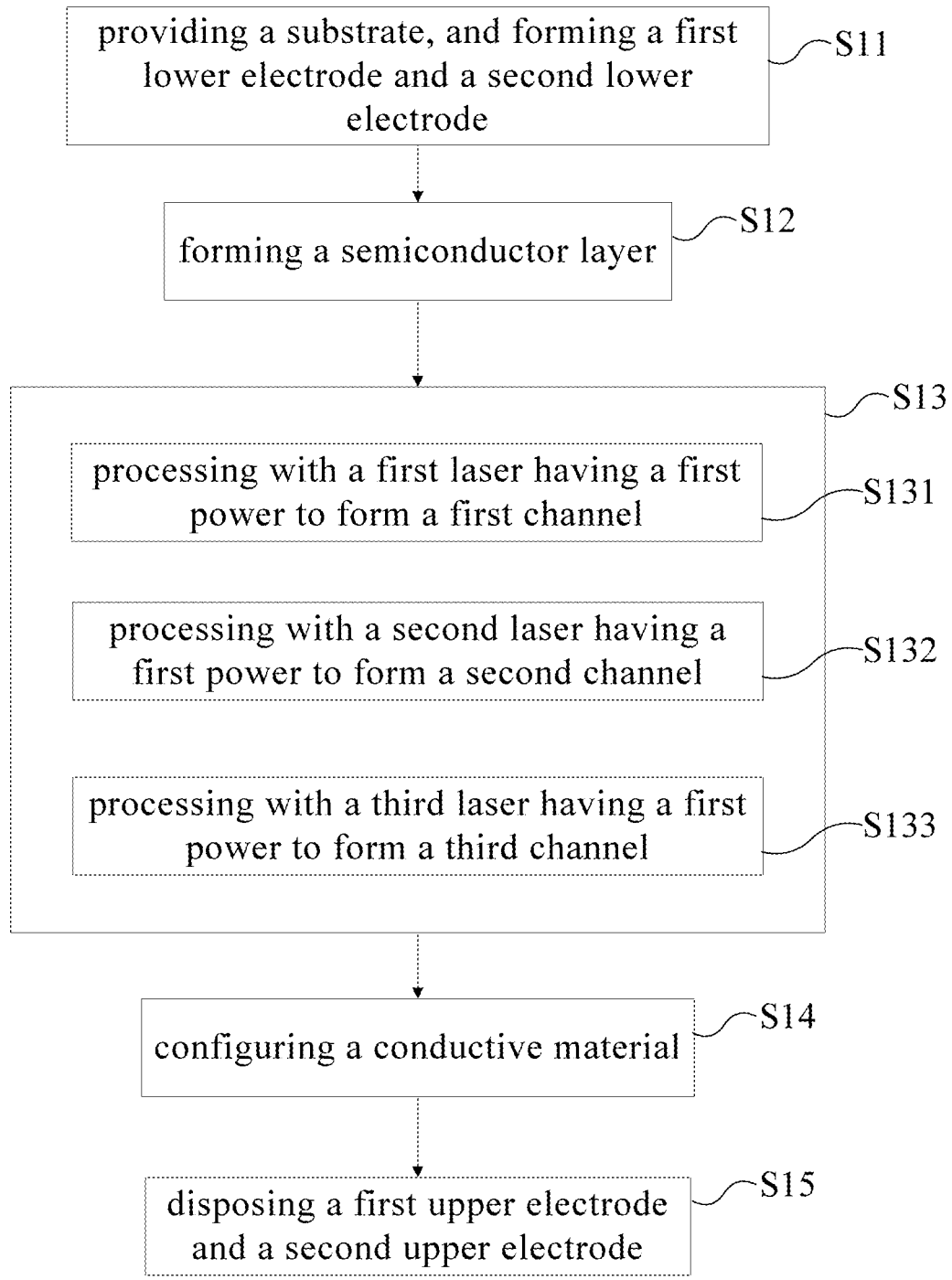
FIG. 9 shows a flowchart of one embodiment of further steps of the manufacturing method of the electronic component of the present invention.

Please refer to FIG. 9. FIG. 9 shows a flowchart of one embodiment of further steps of the manufacturing method of the electronic component of the present invention. Step S13 further includes a sub-step S131: processing the semiconductor layer 13 with a first laser having a first power to form a first channel 140 which is vertical. Wherein, a part of the semiconductor layer 13 on a path of the first laser is removed during the processing of the first laser, so as to form the first channel 140 penetrating the semiconductor layer 13 and coupling a surface of the first upper electrode 201 and a surface of the second lower electrode 210. In practical applications, step S13 further includes at least one of substep S132 and sub-step S133. Sub-step S132: processing the semiconductor layer 13 with a second laser having a second power to form a second channel 141. Sub-step S133: processing the semiconductor layer 13 with a third laser having a third power to form a third channel 142. Wherein, a part of the semiconductor layer 13 on a path of the second laser is removed and a part of the semiconductor layer 13 which is un-ablated by the second laser is remained during the processing of the second laser, so as to form the second channel 141 un-penetrating the semiconductor layer 13. A part of the semiconductor layer 13 on a path of the third laser is removed and a depression 121 in the second lower electrode 210 is formed during the processing of the third laser, so as to form the third channel 142 penetrating the semiconductor layer 13 and coupling the first upper electrode 201 and the depression 121 of the second lower electrode 210.

It should be noted that the above is to clearly distinguish the first channel 140 (ideal ablation), the second channel 141 (incomplete ablation), and the third channel 142 (excessive ablation), representing the individual applied powers in the specification by the first power, the second power, and the third power. However, in actual situations, the multiple power laser processing may form the first channel 140, the second channel 141, and the third channel 142 on the semiconductor layer 13 of different thicknesses during the first laser processing. Therefore, the above-mentioned first power, second power, and third power may be the same or different laser powers, and it is not limited thereto.

Figure 10:
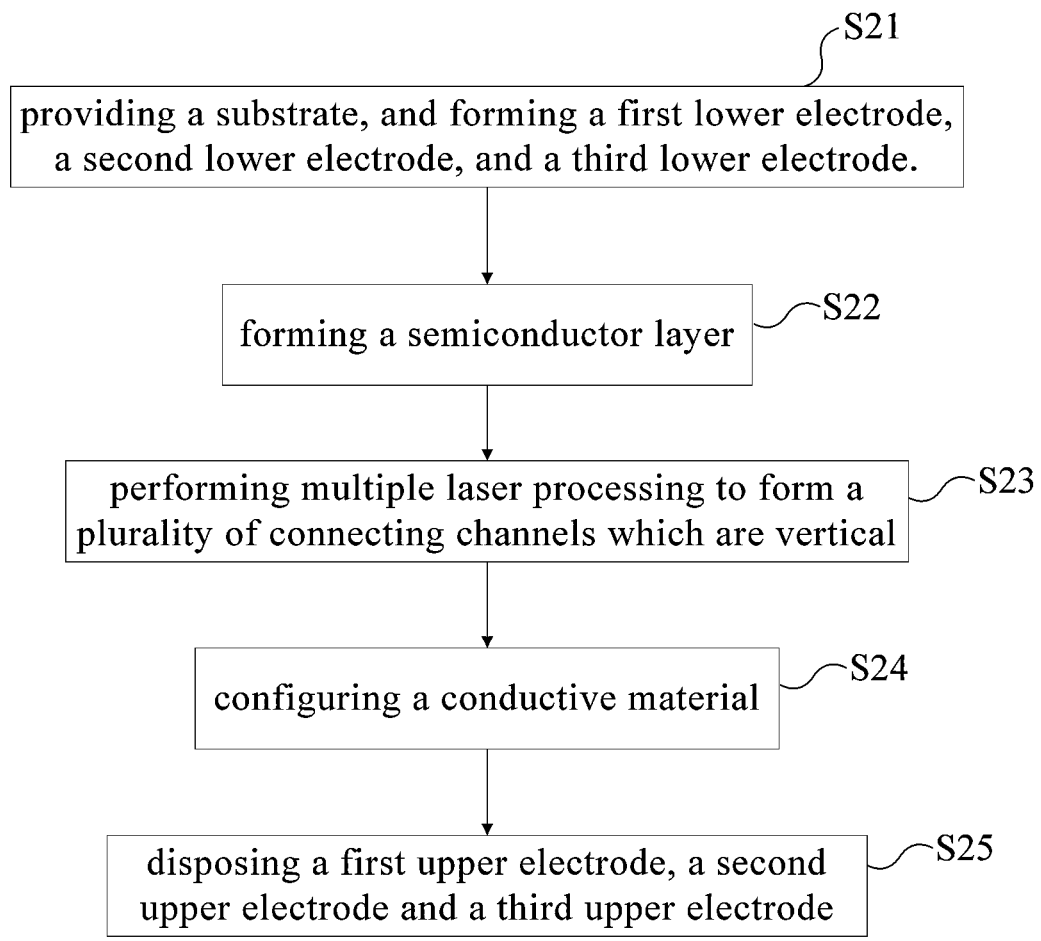
FIG. 10 shows a flowchart of another embodiment of the manufacturing method of the electronic component of the present invention.
Figure 11A:
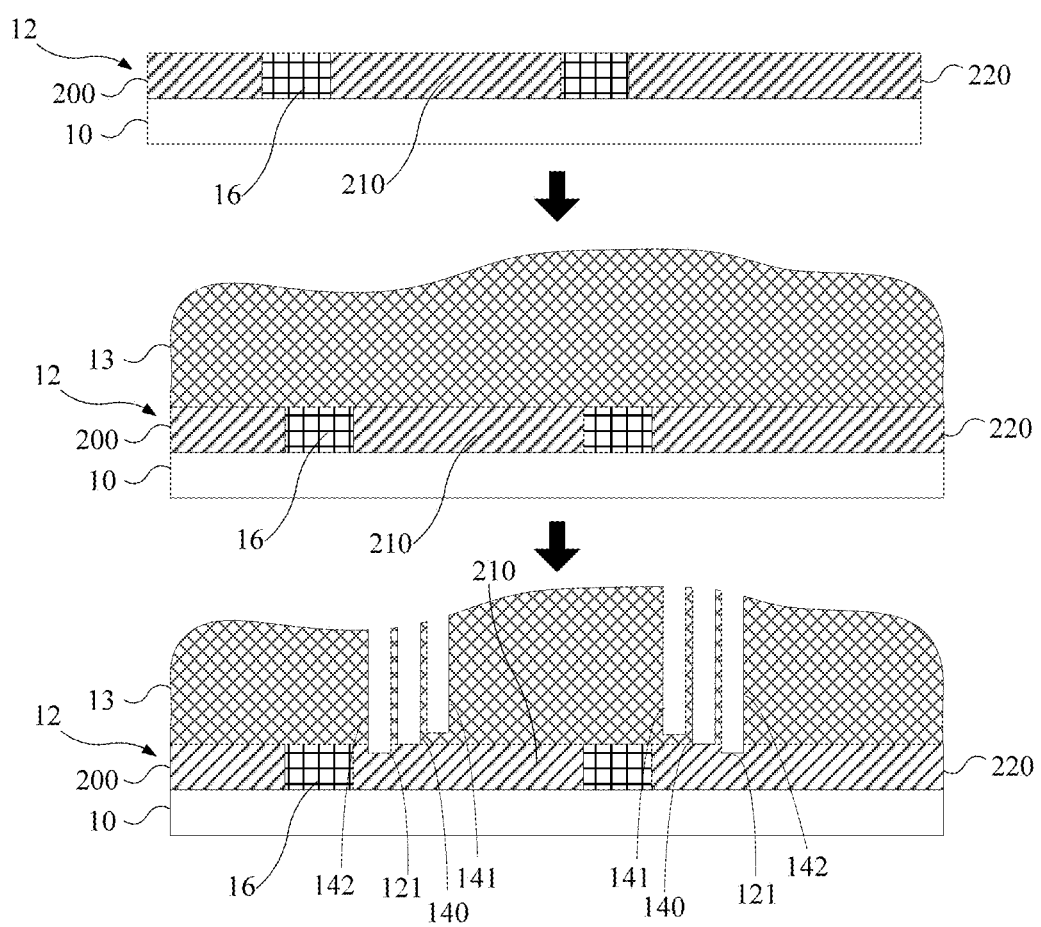
FIGS. 11A and 11B show a schematic diagram of another embodiment of the manufacturing method of the electronic component of the present invention.
Figure 11B:
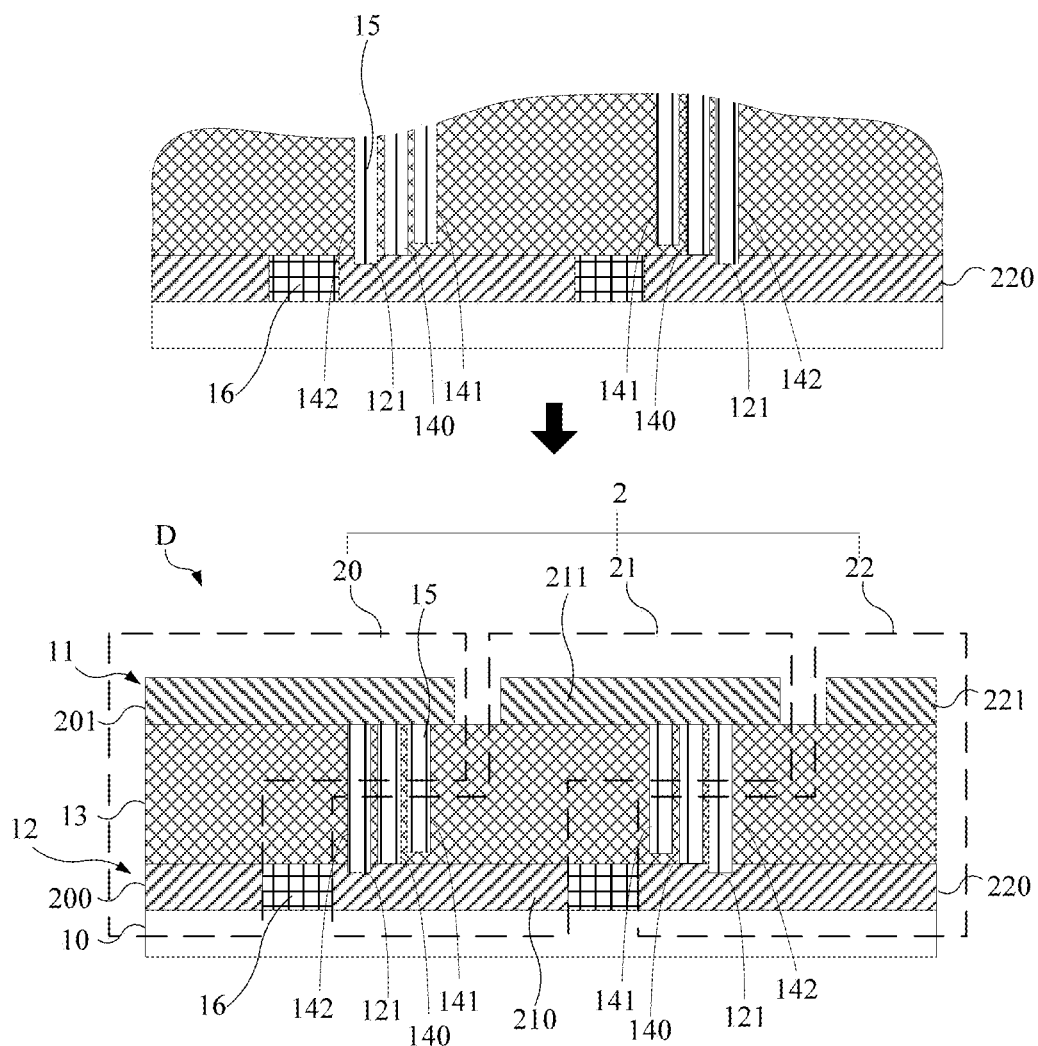

Please refer to FIG. 10 to FIG. 11B. FIG. 10 shows a flowchart of another embodiment of the manufacturing method of the electronic component of the present invention. FIGS. 11A and 11B show a schematic diagram of another embodiment of the manufacturing method of the electronic component of the present invention. The electronic device D is composed of a plurality of electronic components 2. When the number of electronic components 2 is three, the following steps will be performed: step S21: providing a substrate 10, and forming a first lower electrode 200, a second lower electrode 210, a third lower electrode 220 and an insulating material 16 on the substrate 10, wherein the insulating material 16 is configured between the first lower electrode 200 and the second lower electrode 210 and between the second lower electrode 210 and the third lower electrode 220; step S22: forming a semiconductor layer 13 on the first lower electrode 200, the second lower electrode 210, the third lower electrode 220 and the insulating material 16; step S23: performing multiple laser processing with different powers on a position of the semiconductor layer 13 corresponding to the second lower electrode 210 and a position of the semiconductor layer 13 corresponding to the third lower electrode 220 to form a plurality of connecting channels 14 which are vertical; step S24: configuring a conductive material 15 in the connecting channels 14; and step 25: disposing a first upper electrode 201, a second upper electrode 211 and a third upper electrode 221 on the semiconductor layer 13 and the conductive material 15. Wherein, the first upper electrode 201 covers the connecting channels 14 and the conductive material 15 corresponding to the second lower electrode 210, and the second upper electrode 211 covers the connecting channels 14 and the conductive material 15 corresponding to the third lower electrode 220. Wherein, the first upper electrode 201, the first lower electrode 200 and the semiconductor layer 13 between them form a first electronic component 20. The second upper electrode 211, the second lower electrode 210 and the semiconductor layer 13 between them form a second electronic component 21. The third upper electrode 221, the third lower electrode 220 and the semiconductor layer 13 between them form a third electronic component 22. The first upper electrode 201 of the first electronic component 20 and the second lower electrode 210 of the second electronic component 21 are electrically connected through the connecting channels 14 and the conductive material 15 and the second upper electrode 211 of the second electronic component 21 and the third lower electrode 220 of the third electronic component 22 are electrically connected through the connecting channels 14 and the conductive material 15. When the number of electronic components 2 in the electronic device D increases, it will be deduced by analogy, and the number of electronic components 2 is not limited to this.

Wherein, the above-mentioned semiconductor layer includes compound semiconductors such as organic semiconductors, perovskites, copper indium gallium tin (CIGS), copper zinc tin sulfur (CZTS), and other types of thin film solar semiconductor materials. The semiconductor layer may include a stack of multiple layers of different carrier transport functional materials or a mixture of multiple different carrier transport functional materials, and is not limited to a single semiconductor layer in the figure. The conductive material includes metal oxide and metal material.

In summary, with the multiple power laser ablation of the present invention, the probability of achieving ideal ablation in a unit area can be increased, thereby increasing the process yield.

With the detailed description of the above embodiments, it is hoped that the features and spirit of the present invention can be more clearly described, and the scope of the present invention is not limited by the embodiments disclosed above. On the contrary, the intention is to cover various changes and equivalent arrangements within the scope of the patents to be applied for in the present invention.

What is claimed is:

1. An electronic device comprising:
   a substrate;
   a plurality of electronic components configured on the substrate and, the electronic components respectively comprising a lower electrode, a semiconductor layer and an upper electrode sequentially stacked on the substrate, and the electronic components sharing the semiconductor layer, wherein the semiconductor layer comprises a plurality of connecting channels in the semiconductor layer, the connecting channels are located below the upper electrode of a first electronic component of the electronic components and above the lower electrode of a second electronic component of the electronic components, the connecting channels are coupled to a surface of the upper electrode of the first electronic component, wherein the connecting channels comprise a first channel penetrating the semiconductor layer and coupling the surface of the upper electrode of the first electronic component and a surface of the lower electrode of the second electronic component, the connecting channels comprise a second channel which does not penetrate the semiconductor layer, and the connecting channels further comprise a third channel which penetrates the semiconductor layer and is coupled to the surface of the upper electrode of the first electronic component and a depression on the lower electrode of the second electronic component, and the depression is generated by a laser, and the connecting channels are generated by the laser with different powers and depths of the connecting channels are different from each other; and a conductive material configured in the connecting channels to electrically connect the upper electrode of the first electronic component and the lower electrode of the second electronic component, wherein the connecting channels, with different depths, containing the conductive material have different electrical conductivities, wherein an electrical conductivity of the first channel containing the conductive material is higher than that of the third channel containing the conductive material, wherein the depression, which the third channel is coupled to, is a damage on the surface of the lower electrode of the second electronic component, the damage results in a decrease of the electrical conductivity of the third channel containing the conductive material.

2. The electronic device of the claim 1, wherein the electronic device comprises at least one of a photovoltaic device, a photodiode, a light-emitting diode, a capacitor, and a transistor.

3. A manufacturing method of an electronic device comprising the following steps:

providing a substrate, and forming a first lower electrode, a second lower electrode and an insulating material on the substrate, wherein the insulating material is configured between the first lower electrode and the second lower electrode;

forming a semiconductor layer on the first lower electrode, the second lower electrode and the insulating material;

processing the semiconductor layer with a first laser having a first power to form a first channel which is vertical; wherein a part of the semiconductor layer on a path of the first laser is removed during the processing of the first laser, so as to form the first channel;

processing the semiconductor layer with a second laser having a second power to form a second channel which is vertical, wherein the second power of the second laser is lower than the first power of the first laser, a part of the semiconductor layer on a path of the second laser is removed and the other part of the semiconductor layer on a path of the second laser which is not ablated by the second laser is remained during the processing of the second laser, so as to form the second channel which does not penetrate the semiconductor layer;

processing the semiconductor layer with a third laser having a third power to form a third channel which is vertical, wherein the third power of the third laser is higher than the first power of the first laser, a part of the semiconductor layer on a path of the third laser is removed and a depression in the second lower electrode is formed during the processing of the third laser, so as to form the third channel;

configuring a conductive material in a plurality of connecting channels which comprise the first channel, the second channel and the third channel; and disposing a first upper electrode and a second upper electrode on the semiconductor layer and the conductive material, wherein the first upper electrode covers the connecting channels and the conductive material, the connecting channels are coupled to a surface of the first upper electrode, wherein one of the connecting channels is coupled to the second lower electrode;

wherein the first upper electrode, the first lower electrode and the semiconductor layer between them form a first electronic component; the second upper electrode, the second lower electrode and the semiconductor layer between them form a second electronic component; the first upper electrode of the first electronic component and the second lower electrode of the second electronic component are electrically connected through the connecting channels and the conductive material; and wherein, the first channel penetrates the semiconductor layer and couples the surface of the first upper electrode of the first electronic component and a surface of the second lower electrode of the second electronic component, and the third channel penetrates the semiconductor layer and couples the surface of the first upper electrode and the depression of the second lower electrode.

4. The manufacturing method of electronic device of the claim 3, wherein power difference ranges between the first power, the second power and the third power are between 3% to 20%.

5. A manufacturing method of an electronic device comprising the following steps:

providing a substrate, and forming a first lower electrode, a second lower electrode, a third lower electrode and an insulating material on the substrate, wherein the insulating material is configured between the first lower electrode and the second lower electrode and between the second lower electrode and the third lower electrode;

forming a semiconductor layer on the first lower electrode, the second lower electrode, the third lower electrode and the insulating material;

performing multiple laser processing with different powers on a plurality of positions of the semiconductor layer on the second lower electrode to individually form a plurality of first connecting channels which are vertical, wherein depths of the first connecting channels are different from each other, and performing the multiple laser processing with different powers on a plurality of positions of the semiconductor layer on the third lower electrode to individually form a plurality of second connecting channels which are vertical, wherein depths of the second connecting channels are different from each other;

configuring a conductive material in the first connecting channels and the second connecting channels, wherein the first connecting channels, with different depths, containing the conductive material have different electrical conductivities, and the second connecting channels, with different depths, containing the conductive material have different electrical conductivities; and disposing a first upper electrode, a second upper electrode and a third upper electrode on the semiconductor layer and the conductive material, wherein the first upper electrode covers the first connecting channels and the conductive material on the second lower electrode and the first connecting channels are coupled to a surface of the first upper electrode, and the second upper electrode covers the second connecting channels and the conductive material on the third lower electrode and the second connecting channels are coupled to a surface of the second upper electrode;

wherein the first upper electrode, the first lower electrode and the semiconductor layer between them form a first electronic component; the second upper electrode, the second lower electrode and the semiconductor layer between them form a second electronic component; the third upper electrode, the third lower electrode and the semiconductor layer between them form a third electronic component; the first upper electrode of the first electronic component and the second lower electrode of the second electronic component are electrically connected through the first connecting channels and the conductive material and the second upper electrode of the second electronic component and the third lower electrode of the third electronic component are electrically connected through the second connecting channels and the conductive material; and wherein the first connecting channels and the second connecting channels respectively comprise a first channel penetrating the semiconductor layer, the first channel of the first connecting channels couples the surface of the first upper electrode of the first electronic component and a surface of the second lower electrode of the second electronic component, and the second channel of the second connecting channels couples the surface of the second upper electrode of the second electronic component and a surface of the third lower electrode of the third electronic component; the first connecting channels and the second connecting channels respectively comprise a second channel which does not penetrate the semiconductor layer; and the first connecting channels and the second connecting channels respectively further comprise a third channel which penetrates the semiconductor layer, the third channel of the first connecting channels is coupled to the surface of the first upper electrode of the first electronic component and a depression on the second lower electrode of the second electronic component, and the third channel of the second connecting channels is coupled to the surface of the second upper electrode of the second electronic component and a depression on the third lower electrode of the third electronic component, and the depressions are generated by laser.

* * * * *